United States Patent
Aritome (10) Patent No.: US 8,654,588 B2
(45) Date of Patent: Feb. 18, 2014

(54) METHOD OF SOFT PROGRAMMING SEMICONDUCTOR MEMORY DEVICE

(75) Inventor: Seiichi Aritome, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 237 days.

(21) Appl. No.: 13/325,787

(22) Filed: Dec. 14, 2011

(65) Prior Publication Data

US 2012/0155183 A1 Jun. 21, 2012

(30) Foreign Application Priority Data

Dec. 15, 2010 (KR) .......................... 10-2010-0128294

(51) Int. Cl.
*G11C 16/04* (2006.01)

(52) U.S. Cl.
USPC ................. 365/185.19; 365/185.22

(58) Field of Classification Search
USPC ........................... 365/185.19, 185.22, 185.28
See application file for complete search history.

(56) References Cited

U.S. PATENT DOCUMENTS 7,764,544 B2 * 7/2010 Mokhlesi ................. 365/185.03
2010/0277983 A1 * 11/2010 Mokhlesi et al. ........ 365/185.17

FOREIGN PATENT DOCUMENTS

KR 1020080000905 1/2008
KR 1020090048102 5/2009

OTHER PUBLICATIONS

Notice of Allowance issued from the Korean Intellectual Property Office on Oct. 23, 2012.

* cited by examiner

*Primary Examiner* — Vu Le
(74) *Attorney, Agent, or Firm* — IP & T Group LLP (57) ABSTRACT

An operating method of a semiconductor memory device includes erasing all memory cells of a selected cell block, performing a soft program operation on the erased memory cells by supplying a soft program pulse to word lines of the selected cell block, performing a first verify operation using a first voltage level lower than a target voltage level of the soft program operation, performing a second verify operation using the target voltage level, setting voltages of bit lines, and repeating the soft program operation, the first verify operation, the second verify operation, and an operation of setting the voltages of bit lines while raising the soft program pulse gradually.

16 Claims, 6 Drawing Sheets

METHOD OF SOFT PROGRAMMING SEMICONDUCTOR MEMORY DEVICE

CROSS-REFERENCE TO RELATED APPLICATION

Priority to Korean patent application number 10-2010-0128294 filed on Dec. 15, 2010, the entire disclosure of which is incorporated by reference herein, is claimed.

BACKGROUND

Exemplary embodiments relate to a method of soft programming a semiconductor memory device and, more particularly, to an erase method using a soft program operation.

The erase operation of a semiconductor memory device is performed by supplying a high erase voltage to the well of a selected cell block. Here, the erase operation may be performed to lower the threshold voltages of selected memory cells so that they become lower than 0 V. In case of a single level cell (SLC) programmable with one level (that is, one threshold voltage level), when the threshold voltage of the memory cell is lower than 0 V, the memory cell is treated as an erased cell. When the threshold voltage of the memory cell reaches a target positive voltage, the memory cell is treated as a programmed cell. In case of a multi-level cell (MLC), the threshold voltage of an erased memory cell has an effect on a subsequent program operation because the memory cell is programmed with various levels.

Figure 1:
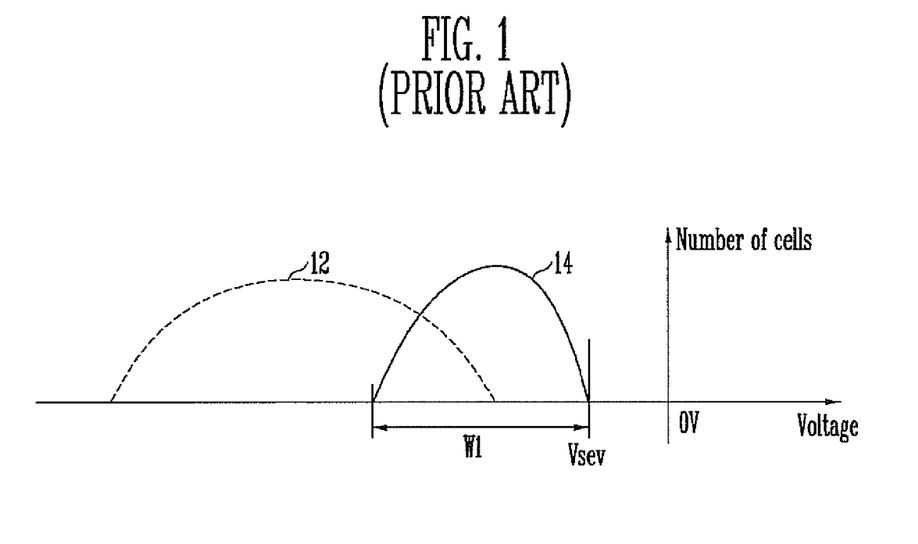
FIG. 1 is a diagram illustrating features of a conventional erase operation.

FIG. 1 is a diagram illustrating features of a conventional erase operation.

Referring to FIG. 1, when the erase operation is performed in order to lower the threshold voltages of all the memory cells of a selected cell block so that the threshold voltages are lower than 0 V (12), the threshold voltage distribution of erased memory cells is wide. This is because the erase operation speed for all the memory cells of the selected cell block may not be substantially the same. For this reason, there is a great difference in the threshold voltage between memory cells having a relatively fast erase operation speed and memory cells having a relatively slow erase operation speed.

In order to reduce the difference in the threshold voltages, a soft program operation is performed after the erase operation. Here, the soft program operation is performed similar to a program operation but stopped if the threshold voltage of any one memory cell reaches a target level (that is, is equal to or greater than) at the time of a verify operation. Accordingly, there is a limit to a reduction in the distribution width W1 of the threshold voltages of memory cells having an erase state using the soft program operation.

BRIEF SUMMARY

According to an exemplary embodiment, after an erase operation is performed on memory cells, a soft program operation for raising the threshold voltages of the memory cells is performed, but the rise of the threshold voltages of memory cells approaching a target level is lowered according to a result of a verify operation during the soft program operation in order to reduce a distribution width of the threshold voltages of memory cells having an erase state.

An operating method of a semiconductor memory device according to an aspect of the present disclosure includes erasing all memory cells of a selected cell block; performing a soft program operation on the erased memory cells by supplying a soft program pulse to word lines of the selected cell block; performing a first verify operation using a first voltage level lower than a target voltage level of the soft program operation; performing a second verify operation using the target voltage level; setting voltages of bit lines by supplying a soft program permission voltage to bit lines coupled to memory cells having threshold voltages lower than the first voltage level, a soft program suppression voltage to bit lines coupled to memory cells having threshold voltages between the first voltage level and the target voltage level, and a soft program inhibition voltage to bit lines coupled to memory cells having threshold voltages equal to or greater the target voltage level in response to the first and second verify operations; and repeating the soft program operation, the first verify operation, the second verify operation, and an operation of setting the voltages of bit lines while raising the soft program pulse gradually until the threshold voltages of all the erased memory cells reach the target voltage level An operating method of a semiconductor memory device according to another aspect of the present disclosure includes erasing all memory cells of a selected cell block; classifying all the memory cells into a plurality of groups; performing a soft program operation by supplying a soft program voltage to word lines belonging to a selected group of memory cells among the groups of memory cells; sequentially performing verify operations for determining whether threshold voltages of the selected memory cells have reached a first voltage level and a target voltage level higher than the first voltage level; setting voltages of bit lines coupled to the selected memory cells by supplying a soft program permission voltage to bit lines coupled to memory cells having threshold voltages lower than the first voltage level, a soft program suppression voltage to bit lines coupled to memory cells having threshold voltages between the first voltage level and the target voltage level, and a soft program inhibition voltage to bit lines coupled to memory cells having threshold voltages reached the target voltage level in response to a result of the verify operations; repeating the soft program operation, the verify operation, and an operation of setting the voltages of the bit lines while gradually raising the soft program voltage until the threshold voltages of the selected memory cells reach the target voltage level; and repeating the soft program operation until the soft program operation is completed on all of the groups.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 2:
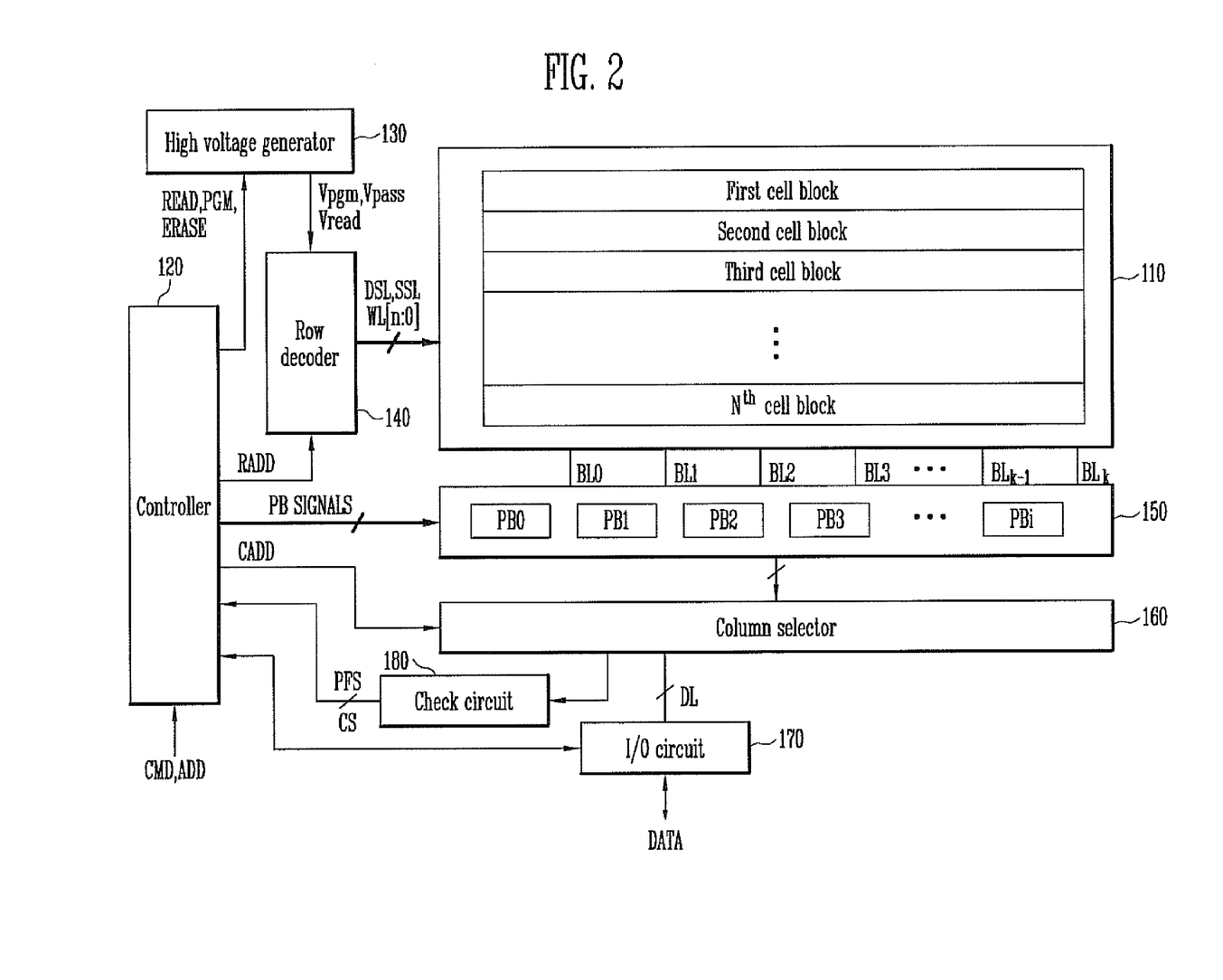
FIG. 2 is a block diagram of a semiconductor memory device for illustrating an erase operation of this disclosure.

FIG. 2 is a block diagram of a semiconductor memory device for illustrating an erase operation of this disclosure.

Referring to FIG. 2, the semiconductor memory device includes a memory cell array 110, an operation circuit group (130, 140, 150, 160, 170, and 180) for performing a program operation or a read operation on the memory cells of the memory cell array 110, and a controller 120 for controlling the operation circuit group (130, 140, 150, 160, 170, and 180) in order to perform a program verify operation in the order of memory cells programmed with a higher level.

It is assumed that the semiconductor memory device is a NAND flash memory device. The operation circuit group includes a high voltage generator 130, a row decoder 140, a page buffer group 150, a column selector 160, an I/O circuit 170, and a check circuit 180.

The memory cell array 110 includes a plurality of cell blocks. Each of the cell blocks includes memory cells for storing data and spare cells for storing various pieces of information, such as the degree (for example, progress/extent) of program, repair information, normal block information, and bad block information. The spare cells included in each cell block are called a spare cell group. Each of the cell blocks includes a plurality of strings ST1 to STk (not shown) including the memory cells for storing data. The strings are coupled to respective bit lines BL1 to BLk.

The controller 120 internally generates a program operation signal PGM, a read operation signal READ, or an erase operation signal ERASE in response to a command signal CMD and also generates control PB SIGNALS for controlling the page buffers PB0 to PBi of the page buffer group 150 according to a type of an operation. The controller 120 also internally generates a row address signal RADD and a column address signal CADD, in response to an address signal ADD. The controller 120 determines whether all program data has been inputted to page buffer group 150 in response to a check signal CS generated by the check circuit 180 at the time of a program operation. Furthermore, the controller 120 determines whether the threshold voltages of selected memory cells have reached a target level in response to a pass/error signal PFS generated by the check circuit 180 after a program verify operation and determines whether to perform the program operation again or finish the program operation according to a result of the check.

The voltage generating circuit (130, 140) supplies the drain select line DSL, the word lines WL0 to WLn, and the source select line SSL of a selected cell block with operating voltages used for a program operation, an erase operation, a read operation, a verify operation, and a verify check operation on memory cells in response to the operation signals READ, PGM, ERASE, and RADD of the controller 120. The voltage generating circuit includes the high voltage generator 130 and the row decoder 140.

The high voltage generator 130 outputs the operating voltages for programming, reading, and erasing the memory cells to global lines in response to the operation signals PGM, READ, ERASE of the controller 120. When the memory cells are sought to be programmed, the high voltage generator 130 outputs operating voltages Vpgm, Vpass, and Vread to the global lines.

The row decoder 140 transfers the operating voltages of the high voltage generator 130 to a cell block, selected from among the cell blocks of the memory cell array 110, in response to the row address signals RADD of the controller 120. That is, the operating voltages are supplied to the local lines DSL, WL[n:0], and SSL of the selected cell block.

The page buffer group 150 includes the page buffers (not shown) coupled to the respective bit lines BL1 to BLk. The page buffer group 150 supplies the bit lines BL1 to BL4 with voltages used for storing data in the memory cells, in response to the control signals PB SIGNALS of the controller 120. More particularly, in a program operation, an erase operation, or a read operation, the page buffer group 150 precharges the bit lines BL1 to BLk or latches data, corresponding to threshold voltages of memory cells which are detected according to a change in the voltages of the bit lines BL1 to BLk. In other words, the page buffer group 150 controls the voltages of the bit lines BL1 to BLk according to data stored in selected memory cells of a selected cell block and detects data stored in the memory cells.

The column selector 160 selects the page buffers of the page buffer group 150 in response to the column address signal CADD. Data latched in page buffers selected by the column selector 160 is outputted.

The I/O circuit 170 transfers external data to the column selector 160 under the control of the controller 120 so that the external data is inputted to the page buffer group 150 at the time of a program operation. When the column selector 160 sequentially transfers the external data to the page buffers of the page buffer group 150, the page buffers store the received data in their latches. Furthermore, in a read operation, the I/O circuit 170 externally outputs data received from the page buffers of the page buffer group 150 via the column selector 160.

The check circuit 180 checks whether a memory cell having a threshold voltage lower than a target level exists in programmed memory cells in a program verify operation performed after a program operation and outputs a result of the check in the form of the pass/error signal PFS. Furthermore, the check circuit 180 counts the number of error bits and generates the number of counted error bits in the form of the check signal CS.

The controller 120 compares a set number of error bits with the check signal CS and performs control so that data regarding a state of a selected cell block is stored in a spare cell group corresponding to the selected cell block according to a result of the comparison.

Figure 3:
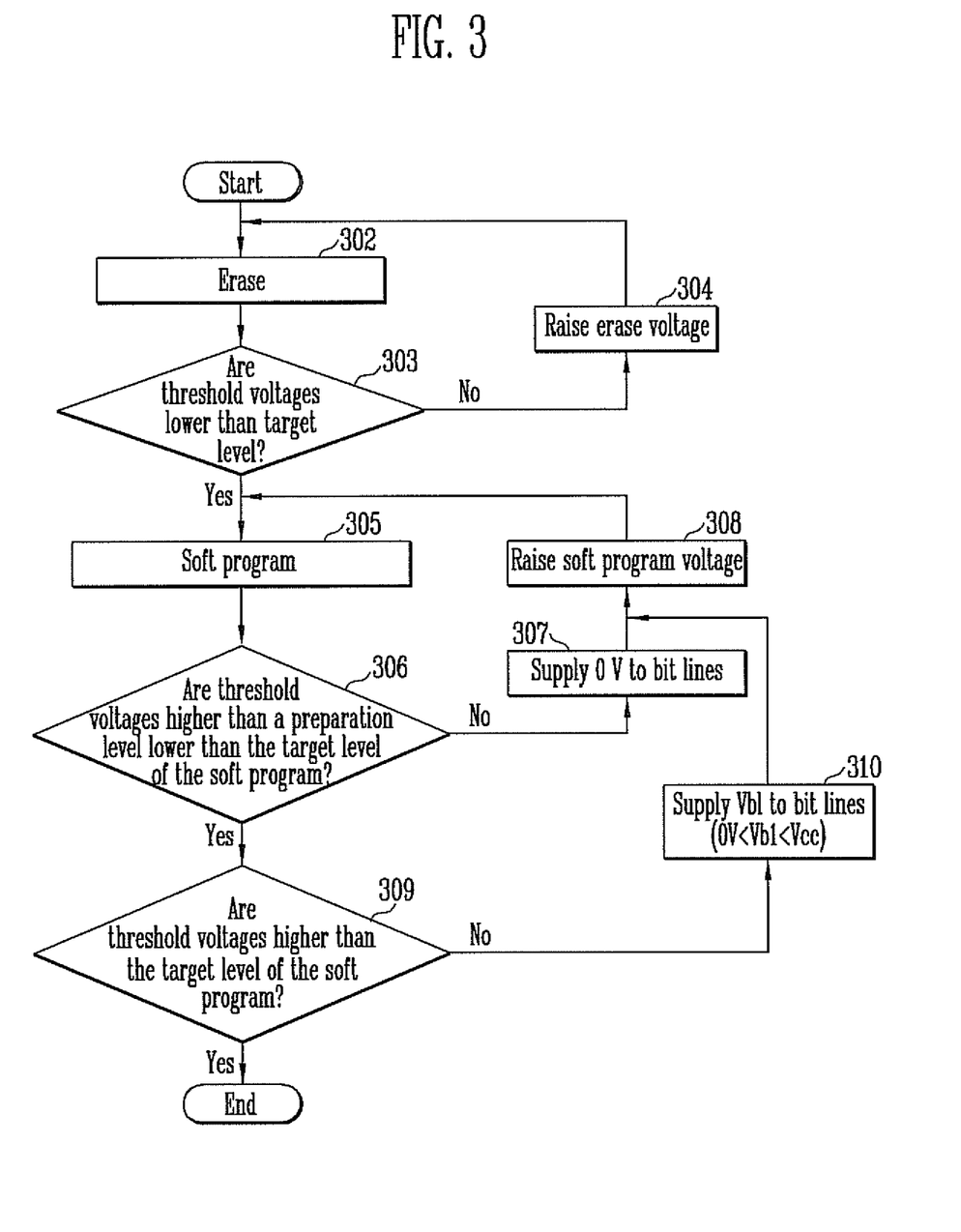
FIG. 3 is a flowchart illustrating the erase operation according to an embodiment of this disclosure.
Figure 4A:
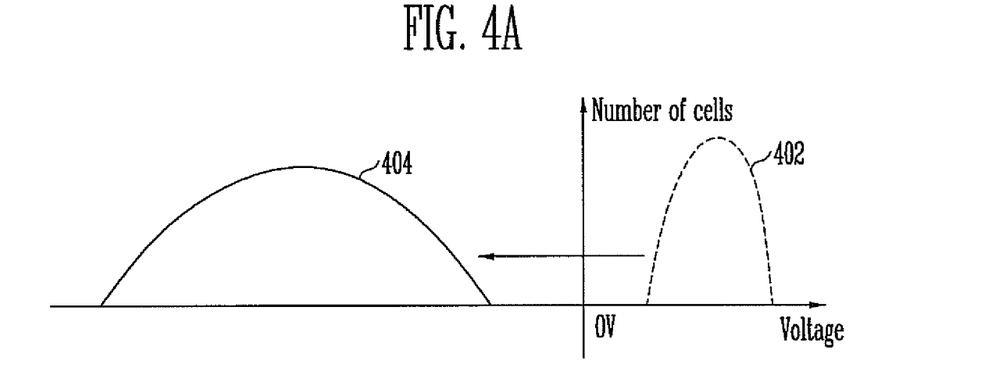
FIGS. 4A and 4B are diagrams illustrating the threshold voltages of memory cells when the erase operation of this disclosure is performed.
Figure 4B:
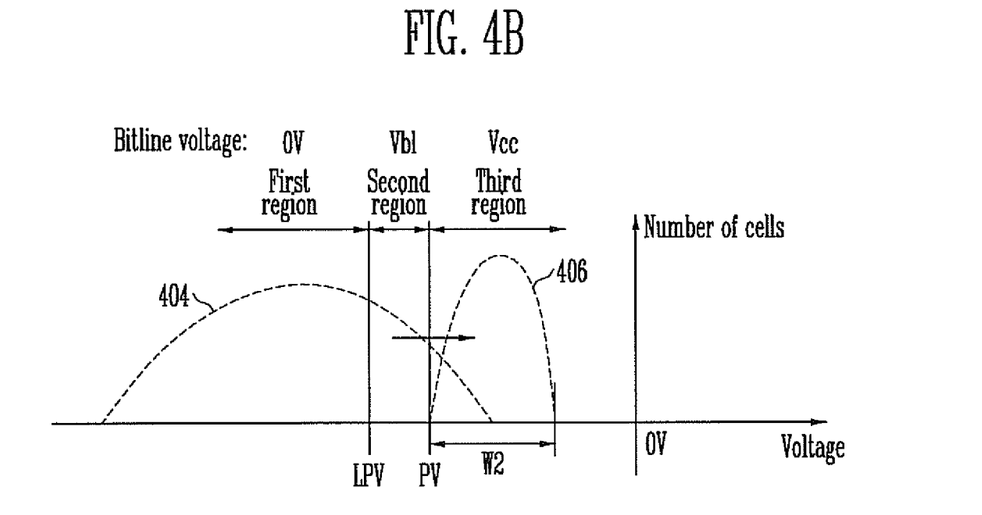

FIG. 3 is a flowchart illustrating the erase operation according to an embodiment of this disclosure, and FIGS. 4A and 4B are diagrams illustrating the threshold voltages of memory cells when the erase operation of this disclosure is performed.

Referring to FIGS. 2, 3, 4A, and 4B, an erase operation is performed on a cell block, selected from the cell blocks of the memory cell array 110, at step 302. The erase operation is performed by supplying an erase voltage to the well of the selected cell block and a ground voltage 0 V to all the word lines of the selected cell block. After the erase voltage is supplied to the well, an erase verify operation is performed in order to determine whether the threshold voltages of all the memory cells of the selected cell block are lower than a target level at step 303. If, as a result of the erase verify operation, the threshold voltages of all the memory cells are not lower than the target level, the erase voltage is raised by a step voltage at step 304 and subsequently the erase operation and the erase verify operation are performed until the threshold voltages of all the memory cells become lower than the target level.

This erase operation is called an erase operation of an incremental step pulse erase (ISPE) method. In the erase verify operation, the target level (that is, target threshold voltage level) may be set to 0 V or a level lower than 0 V. After the erase operation is performed, the threshold voltages of memory cells, having a positive level (e.g., 402 in FIG. 4A), drop to a level lower than 0 V (404), and the threshold voltages of memory cells that are already less than 0 V may remain intact (404).

If, as a result of the erase verify operation at step 305, the threshold voltages of all the memory cells are lower than the target level, a soft program operation is performed at step 305. The soft program operation is performed according to an incremental step pulse program (ISPP) method of supplying a soft program permission voltage (ground voltage 0 V) to all the bit lines coupled to all the memory cells and subsequently supplying all the word lines coupled to all the memory cells with a soft program pulse that gradually rises by a step voltage at each subsequent step. More particularly, the soft program pulse is supplied to all the word lines coupled to the memory cells of the selected cell block. Here, a soft program pulse supplied to the word lines at the beginning is called a start pulse.

Next, a first verify operation using a preparation level (LPV of FIG. 4B) lower than the target level PV of the soft program operation is performed at step 306. Here, it is determined whether the first verify operation using the preparation level LPV is a pass at step 306. If, as a result of the determination, the threshold voltages of all the memory cells are lower than the preparation level LPV, a soft program permission voltage (ground voltage 0 V) is supplied to all the bit lines coupled to all the memory cells at step 307 and subsequently the soft program pulse is raised by a step voltage at step 308. And subsequently the soft program and the first verify operation are performed until the threshold voltages of all the memory cells reach the preparation level LPV.

If, as a result of the determination at step 306, at least one of the threshold voltages of the memory cells is not lower than the preparation level LPV, a second verify operation using the target level PV of the soft program operation is subsequently performed at step 309.

Here, at step 309, it is determined whether the second verify operation using the target level PV is a pass. If, as a result of the determination, there is at least one of memory cells having a threshold voltage between the preparation level LPV and the target level PV, the voltages of the bit lines BL are set again at step 310. The soft program pulse is raised by a step voltage at step 308 and subsequently the soft program, the first verify operation and the second verify operation are performed until the threshold voltages of all the memory cells reach the target level PV.

If, as a result of the determination at step 309, the threshold voltages of all the memory cells are higher than the target level PV, the soft program inhibition voltage Vcc is supplied to the bit lines BL at step 311. And then, a number of the bit lines BL supplied of the soft program inhibition voltage Vcc are counted at step 312. If the number of the bit lines BL supplied of the soft program inhibition voltage Vcc have not reached to criteria number of bit lines, the soft program pulse is raised by a step voltage at step 308 and subsequently the soft program, the first verify operation and the second verify operation are performed until the number of the bit lines BL supplied of the soft program inhibition voltage Vcc have reached to criteria number of bit lines. If the number of the bit lines BL supplied of the soft program inhibition voltage Vcc has reached to criteria number of bit lines, it means that the soft program operation has been completed and thus finished.

A method of setting the voltages of the bit lines at step 310 is described in detail below.

A soft program permission voltage (ground voltage 0 V) is supplied to the bit lines BL coupled to memory cells having threshold voltages of a first region less than the preparation level LPV. A soft program suppression voltage Vbl is supplied to the bit lines BL coupled to memory cells having threshold voltages of a second region which is higher than the preparation level LPV but lower than the target level PV. A soft program inhibition voltage (power source voltage Vcc) is supplied to the bit lines BL coupled to memory cells having threshold voltages of a third region until the threshold voltage of all the remaining memory cells reach the target level PV. The soft program suppression voltage Vbl is higher than the soft program permission voltage 0 V but lower than the soft program inhibition voltage Vcc. According to an example, the soft program suppression voltage Vbl is higher than the soft program permission voltage 0 V but lower than a step voltage of the soft program operation.

After the voltage of the soft program pulse is raised at step 308, the soft program operation using the raised soft program pulse is performed at step 305. Likewise, the steps 305 to 310 are repeated until the threshold voltages of all the memory cells of the selected memory cell reach the target level PV of the soft program operation.

As described above, a sudden rise of the threshold voltages of the memory cells can be prevented by supplying the soft program suppression voltage Vbl to the relevant bit lines during the soft program operation on the memory cells having the threshold voltages higher than the preparation level LPV, but lower than the target level PV. More particularly, when the soft program suppression voltage Vbl is supplied the bit lines, a sudden rise of the threshold voltages of the memory cells can be suppressed at the time of the soft program operation, so that a distribution of the threshold voltage can be prevented from being larger.

Furthermore, the memory cells having the threshold voltages reached the target level PV are memory cells on which the soft program operation has been completed. Thus, the rise of the threshold voltages of the remaining memory cells, not reaching the target level PV, is prevented by supplying the soft program inhibition voltage Vcc to the bit lines coupled to the remaining memory cells until the threshold voltages of all the remaining memory cells reach the target level.

If the soft program operation is performed based on voltages of the bit lines determined according to the threshold voltages of memory cells as described above, a distribution width W2 of the highest threshold voltages in cell string (406) of memory cells having an erase state can become smaller. When the distribution width W2 becomes smaller, the threshold voltages of the memory cells can be easily raised in a subsequent program operation. In particular, a distribution width of the threshold voltages of memory cells having a program state can be prevented from being larger.

Furthermore, when the distribution width of the threshold voltages of the memory cells having a program state becomes smaller, reliability of a read operation can be improved because a difference in the threshold voltages of memory cells having different program states can be increased.

Figure 5:
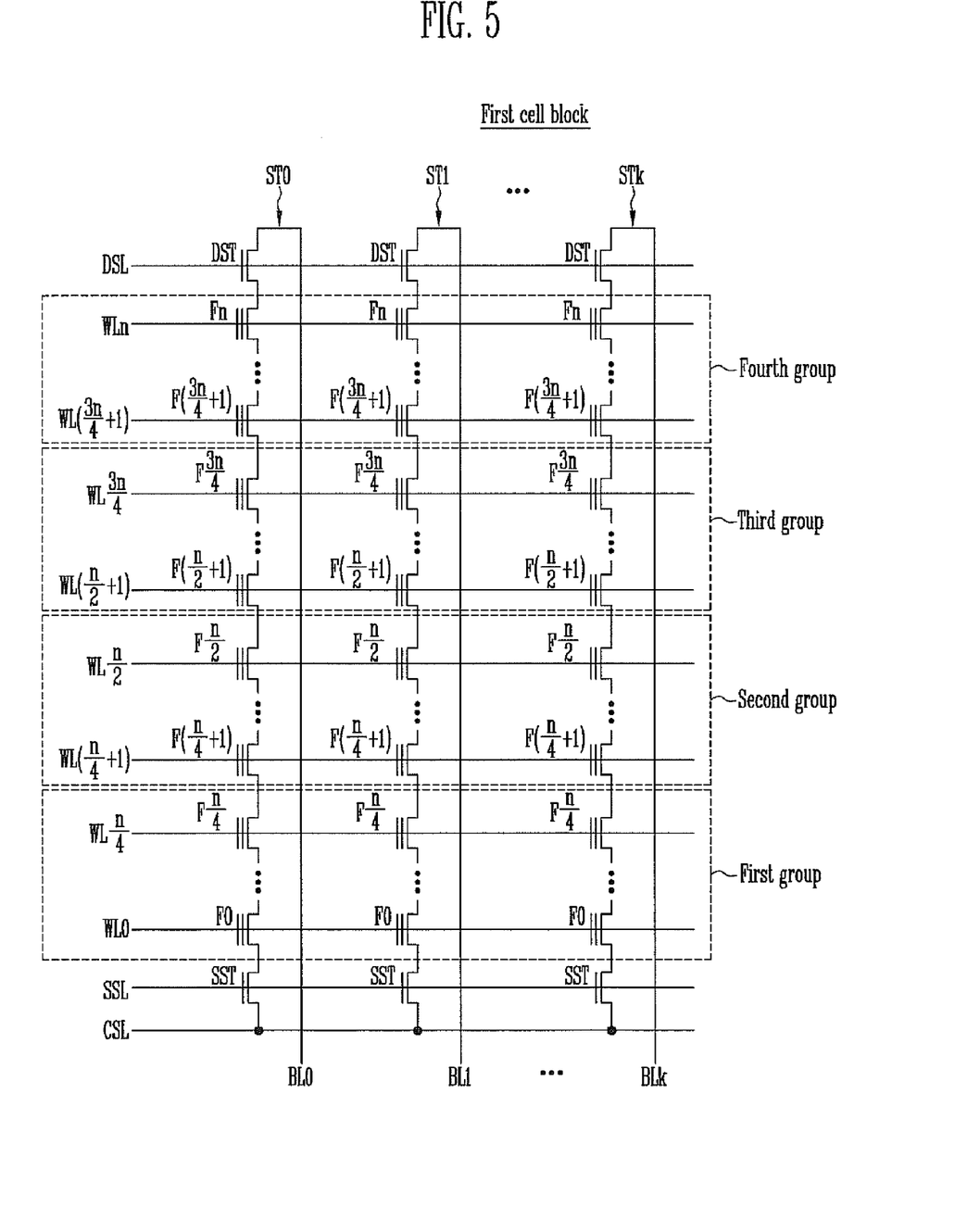
FIG. 5 is a circuit diagram of a first cell block for illustrating an erase operation according to another embodiment of this disclosure.

FIG. 5 is a circuit diagram of a first cell block of the memory cell array for illustrating an erase operation according to another embodiment of this disclosure.

In the present embodiment, a plurality of memory cells included in a cell block on which an erase operation will be performed is classified into a plurality of groups and the erase operation is performed on a group basis in order to prevent a distribution width of the threshold voltage of the memory cells from being widened.

Referring to FIG. 5, if a cell block on which an erase operation will be performed is the first cell block, the first cell block includes a plurality of cell strings ST0 to STk. Each (for example, ST0) of the cell strings includes a drain select transistor DST, a source select transistor SST, and a plurality of memory cells F0 to Fn coupled in series between the drain select transistor DST and the source select transistor SST. The drains of the drain select transistors DST of the respective cell strings ST0 to STk are coupled to respective bit lines BLD to BLk, and the sources of the source select transistors SST thereof are coupled to a common source line CSL. The gates of the drain select transistors DST of the respective cell strings ST0 to STk are coupled to a drain select line DSL, and the gates of the source select transistors SST thereof are coupled to a source select line SSL. Furthermore, the gates of the memory cells F0 to Fn of the respective cell strings ST0 to STk are coupled to respective word lines WL0 to WLn.

In order to perform the erase operation, the memory cells are classified on a word-line basis, but may be classified into two or more groups of memory cells. For example, if the memory cells are classified into four groups, the memory cells coupled to $0^{th}$ to $(n/4)^{th}$ word lines may be designated as a first group, the memory cells coupled to $\{(n/4)+1\}^{th}$ to $(n/2)^{th}$ word lines may be designated as a second group, the memory cells coupled to $\{(n/2)+1\}^{th}$ to $(2n/4)^{th}$ word lines may be designated as a third group, and the memory cells coupled to $\{(3n/4)+1\}^{th}$ to $n^{th}$ word lines may be designated as a fourth group.

Figure 6:
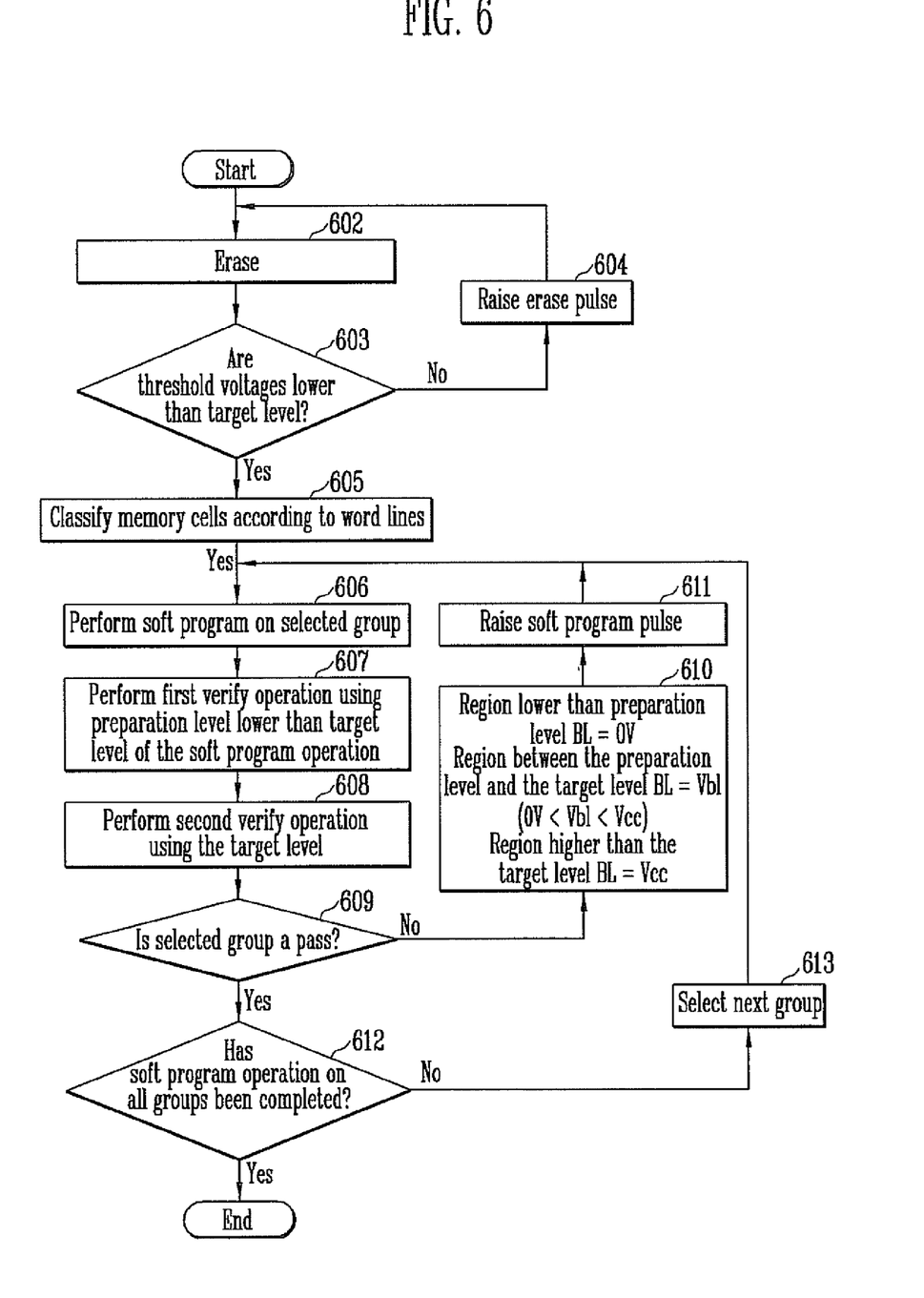
FIG. 6 is a flowchart illustrating the erase operation according to another embodiment of this disclosure.

FIG. 6 is a flowchart illustrating an erase operation according to another embodiment of this disclosure. Referring to FIG. 6, one cell block on which an erase operation will be performed is selected from among the plurality of cell blocks, and the erase operation is performed on the selected cell block at step 602. The erase operation is performed by supplying an erase voltage to the well of the selected cell block and the ground voltage 0 V to all the word lines coupled to the selected cell block. Next, an erase verify operation is performed in order to determine whether the threshold voltages of all memory cells coupled to all the word lines become lower than the erase voltage at step 603. The erase operation and the erase verify operation are repeated at steps 602 to 603 while the erase voltage is raised at step 604 according to a result of the erase verify operation until the threshold voltages of all the memory cells become lower than the erase voltage. The erase operation may be set to 0 V or a target level lower than 0 V. After the erase operation is performed, the threshold voltages of all memory cells programmed with a positive level become lower than 0 V, and the threshold voltages of memory cells that are already lower than 0 V maintain 0 V.

If, as a result of the determination at step 603, the threshold voltages of all the memory cells become lower than the target level, all the memory cells of the selected cell block are classified into groups according to the word lines as described with reference to FIG. 5 at step 605.

One cell group is selected from among the classified groups, and a soft program operation is performed on the selected cell group at step 606. The soft program operation is performed according to an incremental step pulse program (ISPP) method of supplying a soft program permission voltage (ground voltage 0 V) to all the bit lines coupled to all the memory cells and subsequently supplying all the word lines coupled to all the memory cells with a soft program pulse that gradually rises by a step voltage at each subsequent step. More particularly, the soft program pulse is supplied to all the word lines coupled to the memory cells of the selected cell block. Here, a soft program pulse supplied to the word lines at the beginning (that is, initial soft program pulse) is called a start pulse.

Next, a first verify operation using a preparation level LPV lower than the target level PV of the soft program operation is performed at step 607, and a second verify operation using the target level PV is performed at step 608.

It is subsequently determined whether the second verify operation using the target level PV at step 608 is a pass at step 609. If, as a result of the determination, the threshold voltages of all the memory cells of the selected cell group have reached the target level PV, it means that the soft program operation has been completed and thus it is determined whether the soft program operation has been performed on all the groups at step 612.

Meanwhile, if, as a result of the determination at step 609, the threshold voltages of all the memory cells of the selected cell group have not reached the target level PV, the voltages of the bit lines are set again at step 610.

A method of setting the voltages of the bit lines is described in detail below.

The soft program permission voltage (ground voltage 0 V) is supplied to the bit lines BL coupled to memory cells having threshold voltages belonging to the first section less than the preparation level LPV. The soft program suppression voltage Vbl is supplied to the bit lines BL coupled to memory cells having threshold voltages belonging to the second section which is higher than the preparation level LPV but lower than the target level PV. The soft program inhibition voltage (power source voltage Vcc) is supplied to the bit lines BL coupled to memory cells having threshold voltages belonging to the third section until the threshold voltage of all the remaining memory cells reach the target level PV. The soft program suppression voltage Vbl is higher than the soft program permission voltage 0 V but lower than the soft program inhibition voltage Vec. According to an example, the soft program suppression voltage Vbl is higher than the soft program permission voltage 0 V but lower than a step voltage of the soft program operation.

After the soft program pulse is raised at each step 611, the soft program operation using the raised soft program pulse, the first and second verify operations, and the subsequent processes are repeated at steps 606 to 611 until the threshold voltages of all the memory cells of the selected cell block reach the target level PV.

If, as a result of the determination at step 612, the soft program operation on all the cell groups has not been completed, a next cell group is selected at step 613, and the soft program operation using the raised soft program pulse, the first and second verify operations, and the subsequent processes are repeated at steps 606 to 613 until the threshold voltages of all the memory cells of the next cell block reach the target level PV.

As described above, the steps 606 to 613 are repeated until the soft program operation is completed on all the cell groups of the selected cell block.

As described above, the threshold voltages of memory cells having an erase state can be further raised by performing the soft program operation according to voltages of the bit lines which are determined according to the threshold voltages. Accordingly, the distribution width W2 of the threshold voltages (406) of the memory cells having an erase state can become smaller.

When the distribution width W2 becomes smaller, the threshold voltages of the memory cells can be easily raised in a subsequent program operation. In particular, a distribution width of the threshold voltages of memory cells having a program state can be prevented from being larger. When the distribution width of the threshold voltages of memory cells having a program state becomes smaller, a difference in the threshold voltages of memory cells having different program states can be increased. Consequently, adequate reliability of a read operation can be obtained.

In accordance with this disclosure, the threshold voltages of memory cells having an erase state can be raised and, at the same time, a distribution width of the threshold voltages of the memory cells can become smaller. Accordingly, a subsequent program operation can be easily performed.

What is claimed is:

1. An operating method of a semiconductor memory device, comprising:
    erasing all memory cells of a selected cell block;
    performing a soft program operation on the erased memory cells by supplying a soft program pulse to word lines of the selected cell block;
    performing a first verify operation using a first voltage level lower than a target voltage level of the soft program operation;
    performing a second verify operation using the target voltage level;
    setting voltages of bit lines by supplying a soft program permission voltage to bit lines coupled to memory cells having threshold voltages lower than the first voltage level, a soft program suppression voltage to bit lines coupled to memory cells having threshold voltages between the first voltage level and the target voltage level, and a soft program inhibition voltage to bit lines coupled to memory cells having threshold voltages equal to or greater the target voltage level in response to the first and second verify operations; and
    repeating the soft program operation, the first verify operation, the second verify operation, and an operation of setting the voltages of bit lines while raising the soft program pulse gradually until the threshold voltages of all the erased memory cells reach the target voltage level.

2. The method of claim 1, wherein the erasing of the memory cells of the selected cell block is performed according to an incremental step pulse erase (ISPE) method of supplying a well of the selected cell block with a gradually rising erase pulse.

3. The method of claim 2, further comprising supplying a ground voltage to the word lines while supplying the erase pulse to the well.

4. The method of claim 1, wherein the target voltage level is set to be lower than a ground voltage.

5. The method of claim 1, wherein:
    the soft program permission voltage is a ground voltage, and
    the soft program inhibition voltage is a power source voltage.

6. The method of claim 5, wherein the soft program suppression voltage is higher than the soft program permission voltage but lower than a step voltage of the soft program operation.

7. The method of claim 1, further comprising counting a number of bit lines coupled to memory cells having threshold voltages equal to or greater the target voltage level after supplying a soft program inhibition voltage to bit lines coupled to memory cells having threshold voltages equal to or greater the target voltage level.

8. The method of claim 7, wherein the soft program operation, the first verify operation, the second verify operation, an operation of setting the voltages of bit lines while raising the soft program pulse gradually, and counting the number of the bit lines until the number of bit lines coupled to memory cells having threshold voltages equal to or greater the target voltage has reached to criteria number of bit lines.

9. An operating method of a semiconductor memory device, comprising:
    erasing all memory cells of a selected cell block;
    classifying the memory cells into a plurality of groups;
    performing a soft program operation by supplying a soft program voltage to word lines belonging to a selected group of memory cells among the groups of memory cells;
    sequentially performing verify operations for determining whether threshold voltages of the selected memory cells have reached a first voltage level and a target voltage level higher than the first voltage level; and
    setting voltages of bit lines coupled to the selected memory cells by supplying a soft program permission voltage to bit lines coupled to memory cells having threshold voltages lower than the first voltage level, a soft program suppression voltage to bit lines coupled to memory cells having threshold voltages between the first voltage level and the target voltage level, and a soft program inhibition voltage to bit lines coupled to memory cells having threshold voltages reached the target voltage level in response to a result of the verify operations;
    repeating the soft program operation, the verify operation, and an operation of setting the voltages of the bit lines while gradually raising the soft program voltage until the threshold voltages of the selected memory cells reach the target voltage level; and
    repeating the soft program operation until the soft program operation is completed on all of the groups.

10. The method of claim 9, wherein erasing all the memory cells of the selected cell block is performed by supplying an erase voltage to a well of the selected cell block and a ground voltage to word lines coupled to all the memory cells of the selected cell block.

11. The method of claim 10, wherein the groups are classified based on word lines coupled to the selected cell block.

12. The method of claim 9, further comprising supplying a soft program pass voltage to word lines coupled to remaining unselected groups in the soft program operation performed on the selected group.

13. The method of claim 9, wherein the target voltage level is lower than a ground voltage.

14. The method of claim 9, wherein:
    the soft program permission voltage is a ground voltage, and
    the soft program inhibition voltage is a power source voltage.

15. The method of claim 14, wherein the soft program suppression voltage is higher than the soft program permission voltage but lower than a step voltage of the soft program operation.

16. The method of claim 9, further comprising selecting a next group and performing the soft program operation on the next group after the soft program operation is completed on the selected group.

* * * * *